(12) United States Patent
Vo et al.

(10) Patent No.: US 6,603,269 B1
(45) Date of Patent: Aug. 5, 2003

(54) RESONANT CHAMBER APPLICATOR FOR REMOTE PLASMA SOURCE

(75) Inventors: Be Van Vo, Santa Clara, CA (US); Salvador P. Umotoy, Antioch, CA (US); Son N. Trinh, Cupertino, CA (US); Lawrence Chung-Lai Lei, Milpitas, CA (US); Sergio Edelstein, Los Gatos, CA (US); Avi Tepman, Cupertino, CA (US); Chien-Teh Kao, Sunnyvale, CA (US); Kenneth Tsai, Emerald Hills, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/593,586

(22) Filed: Jun. 13, 2000

(51) Int. Cl.⁷ .............................................. C23C 16/00
(52) U.S. Cl. .......................... 315/111.21; 118/723 ME; 156/345; 250/492.2
(58) Field of Search ....................... 315/111.21, 111.61, 315/111.81, 111.41, 111.71, 111.11, 111.31, 111.51; 156/345; 250/492.2, 504 R; 118/723 ME, 723 MW

(56) References Cited

U.S. PATENT DOCUMENTS

| | | | |
|---|---|---|---|
| 5,625,259 A | 4/1997 | Holber et al. ........... 315/111.21 |
| 5,747,917 A | 5/1998 | Herchen ................ 313/231.31 |
| 5,895,548 A | 4/1999 | Ettinger et al. ............. 156/345 |
| 5,902,404 A | 5/1999 | Fong et al. .......... 118/723 ME |
| 6,026,762 A | 2/2000 | Kao et al. .................... 156/345 |
| 6,180,952 B1 * | 1/2001 | Haas et al. ............. 315/111.21 |
| 6,211,621 B1 * | 4/2001 | Caughran et al. ....... 315/111.21 |

* cited by examiner

Primary Examiner—Don Wong
Assistant Examiner—Wilson Lee
(74) Attorney, Agent, or Firm—Konrad Raynes Victor & Mann LLP

(57) ABSTRACT

An improved plasma applicator for remotely generating a plasma for use in semiconductor manufacturing is provided. In one embodiment, a plasma applicator is comprised of a chamber assembly, a removable waveguide adapter and a circular clamp which secures the adapter to the chamber assembly. The chamber assembly includes an aperture plate, a microwave transparent window, a chamber body and a microwave sensor which is mounted on the chamber body. The chamber body has a proximate end opening adapted to admit microwave energy into the cavity and a distal end disposed generally on the opposite side of the cavity from the proximate end opening. The chamber body further has a gas outlet port adapted to permit the flow of an excited gas out of the cavity and a gas inlet port adapted to admit a precursor gas into the cavity. The gas inlet port has a center axis which is disposed between the proximate end opening of the chamber body and the midpoint between the proximate end opening and the distal end of the body.

7 Claims, 13 Drawing Sheets

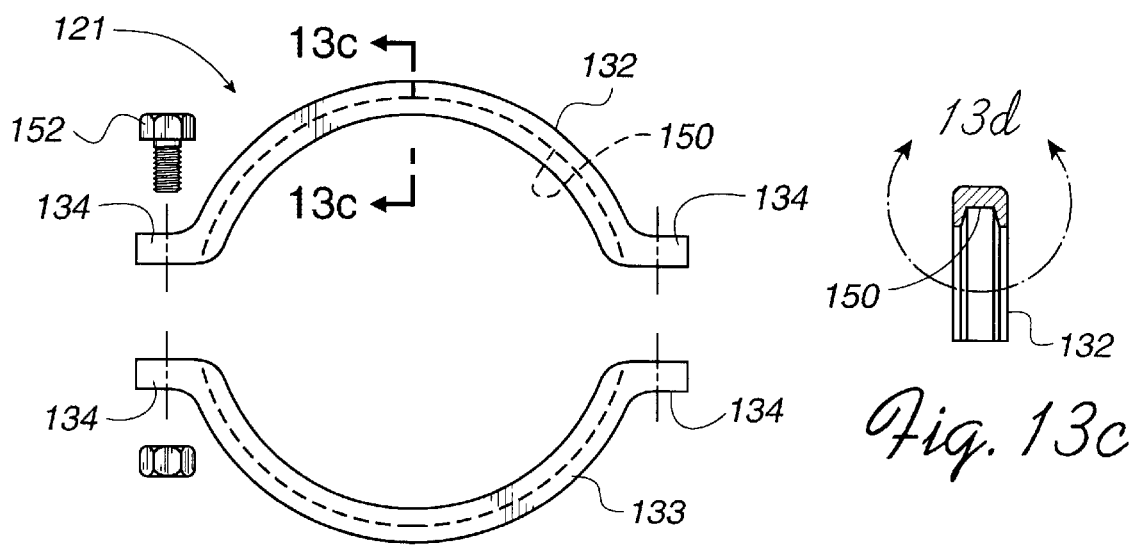
Fig. 13a
Fig. 13c
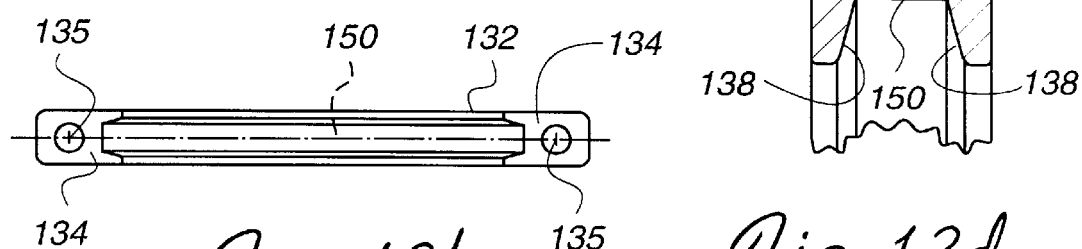
Fig. 13b
Fig. 13d
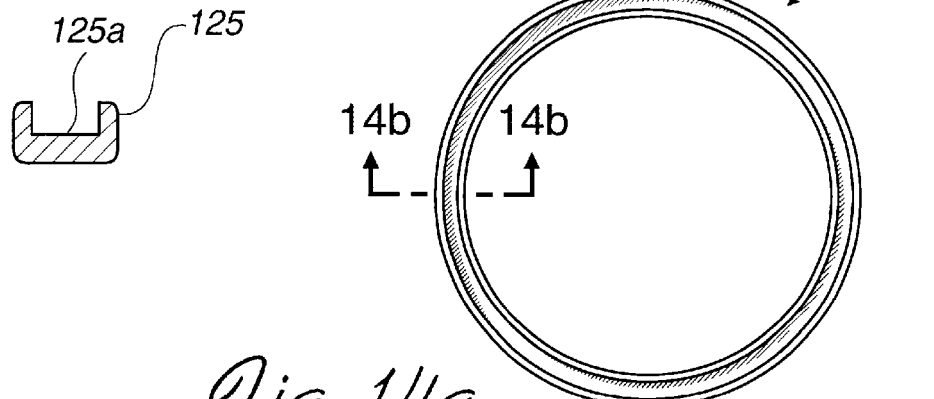
Fig. 14b
Fig. 14a

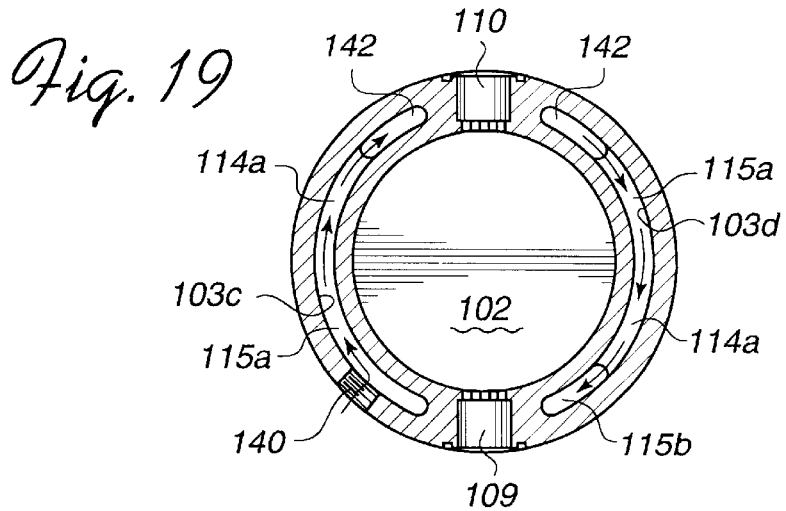
Fig. 19
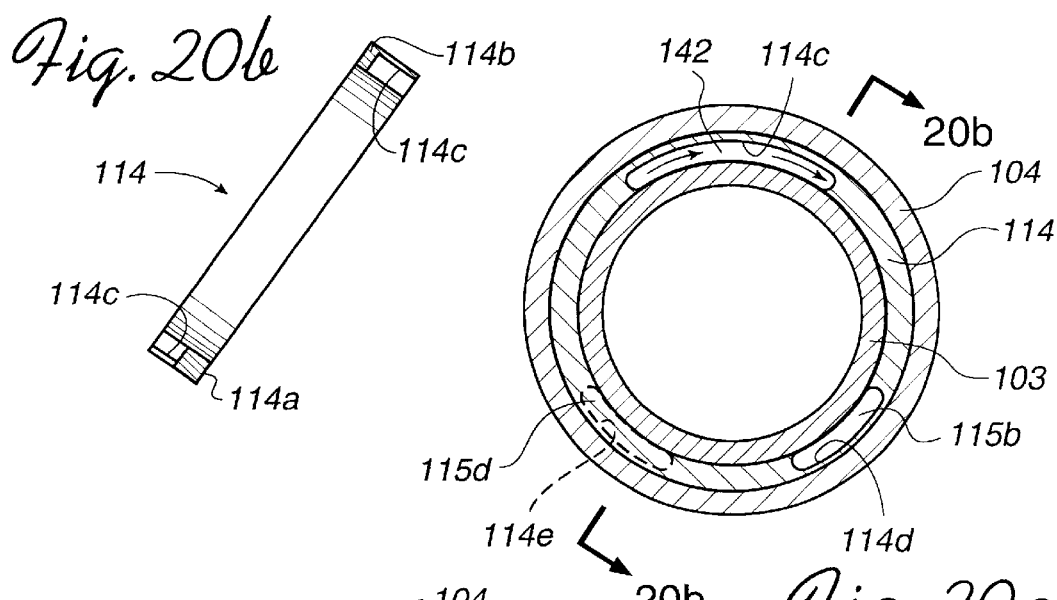
Fig. 20b
Fig. 20a
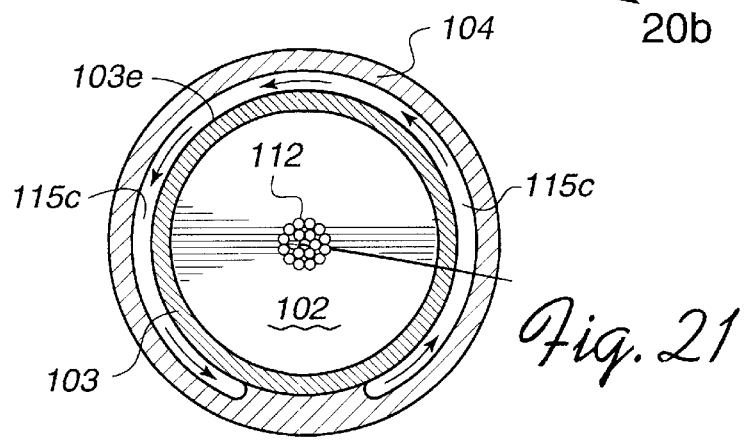
Fig. 21

RESONANT CHAMBER APPLICATOR FOR REMOTE PLASMA SOURCE

BACKGROUND OF THE INVENTION

1. Field of the Invention

The present invention relates generally to a remote plasma source for exciting a process gas into a plasma state. More particularly, the present invention relates to a plasma applicator for delivering excited gas species into a processing chamber in which a substrate is to be processed.

2. Description of the Related Art

Plasma processing is an important tool of the semiconductor manufacturing industry. This processing uses electromagnetic radiation to strike a plasma that produces a reactive species that is used for such process steps as wafer etching. A plasma may be produced directly above the surface of the wafer within the process environment, or the plasma may be remotely generated in an applicator, and then conducted to the surface of the wafer.

FIG. 1 illustrates a known, remote plasma source 10 which can be used as a stand alone plasma source for cleaning, etching or depositing materials in a processing chamber 4 or in conjunction with other plasma sources inside or outside a processing chamber. The remote plasma source 10 generally comprises a microwave generator 2 coupled by a waveguide 11 in communication with a generally cylindrically-shaped resonant cavity or chamber 12.

The resonant chamber 12, generally defined by a microwave reflective shell such as an outer metal housing or cover 13, includes a microwave transparent tube 14 that extends down through the chamber 12 along its radial axis for the passage of gases to be activated or excited and delivered to the processing chamber 4. The tube 14 is typically made of a microwave transparent, dielectric material, such as sapphire, quartz, ceramic, borosilicate glass or the like. A compressible material layer 25 may be disposed between the outer shell 13 and the tube 14 to secure the two members while allowing for differences in expansion under a wide range of temperatures.

The housing 13 of the plasma source 10 has a removable first lid 20 with a gas inlet port 21 and a removable second lid 22 with a gas outlet port 23. The gas inlet and outlet ports 21 and 23 are typically aligned with and centered on the radial axis of the chamber 12. The gas inlet port 21 in the first lid 20 supplies low pressure precursor gases into the microwave transparent tube 14 in the resonant chamber 12 where the gases can be ionized. The gas outlet port 23 in the second lid 22 allows the excited gases to flow from the resonant chamber 12 into the processing chamber (not shown).

A rectangular, transverse slot 24 is disposed through a cylindrical central portion 6 of the outer metal cover 13 to inject microwave energy from the microwave generator through the internal microwave tube wall 14 to the cavity. The microwave energy enters the resonant chamber 12 through the cylindrical side wall of portion 6 to excite a gas provided therein into a plasma state.

A plurality of coolant passages 15 are disposed in the cylindrical walls of the central portion 6 of the outer metal cover 13 so that a cooling fluid may be passed through them in order to dissipate heat generated in the plasma cavity. The cooling fluid enters a coolant inlet port 16 whereupon it flows through an inlet manifold 17 disposed in the first lid 20, down parallel flow paths through the passages 15 to an outlet manifold 18 and exits via the coolant outlet port 19 disposed in the second lid 22.

FIGS. 2–6 depict another, known plasma applicator of a different design. Referring first to FIGS. 2 and 3, the plasma applicator 30 includes a removable, front cover plate 32, a removable, rear cover plate 33 and a central body member 31 having a resonant chamber 46. The central body member 31 and resonant chamber 46 are cylindrical in shape, the radial axis of which extends through the front and rear cover plates 32 and 33. A gas inlet port 34 and a gas outlet port (not shown) are formed on generally opposite sides of the cylindrical side walls of the body 31 and are typically centered approximately midway between the front cover plate 32 and rear cover plate 33. A coolant inlet port 35 and coolant outlet port 36 are located generally adjacent to one another on the same side of the body 31.

Situated between the front cover plate 32 and the body 31 are a microwave transparent window member 37 and an aperture plate 38 having a rectangular aperture 39 which is centered in the middle of the plate 38. The window member 37 is usually made of aluminum nitride, a material which is transparent to microwaves, yet substantially impermeable to the plasma gases typically contained within the resonant chamber 46. Three O-rings 40, 41 and 42, form a pressure-tight seal between the front cover plate 32, the window member 37, the aperture plate 38, and the body 31. As best seen in FIG. 6, the O-ring 40 is an aluminum member disposed in the front cover plate 32 and having teats 58 formed along opposing sides of the O-ring. A force is applied by the O-ring 40 against the window 37 which pushes it towards the O-ring 41 and the aperture plate 38.

The front cover plate 32 includes a plurality of cover plate bolt holes 43 for securing the cover plate 32 to the remainder of the assembly. A plurality of waveguide bolt holes 44 are also disposed in the front cover plate 32 in order to permit the attachment of the waveguide portion of a microwave generator (not shown) to the cover plate 32. Finally, a generally rectangular opening 45 is also disposed in the cover plate 32 in order to permit passage of microwaves from a microwave generator through the cover plate 32, the aluminum nitride window 37, the rectangular aperture 39 of the aperture plate 38 and into the resonant chamber 46.

FIG. 4 shows the end of the plasma applicator 30 containing the rear cover plate 33 assembly. Situated between the rear cover plate 33 and the body 31 are an aluminum nitride window 47 and a center plate 48 having a sensor port 49 disposed in the center of the plate 48. O-rings 50 and 51 are placed between the body 31, the center plate 48 and the aluminum nitride window 47 in order to form a pressure-tight seal. A microwave detector 52 is attached to the center of the rear cover plate 33 directly over a rear cover plate port 53 in order to receive and detect microwaves passing from the resonant chamber 46, through the sensor port 49, the aluminum nitride window 47 and the rear cover plate port 53. The detector 52 measures the amount of microwave energy in the chamber 46 thereby permitting the operator to make energy adjustments as operational conditions require.

FIG. 5 shows the coolant flow path of the plasma applicator 30. Coolant fluid, such as water, enters the body 31 via the coolant inlet port 35. The coolant then flows into a circular inlet manifold 55 which is formed within and encircles the body 31. From the inlet manifold 55 the coolant flows in parallel paths through a plurality of straight, parallel channels 56 to a circular outlet manifold 57 which, like the inlet manifold 55, encircles the body 31. The coolant exits through the coolant outlet port 36. This arrangement has some problems however. It has been noted by the present applicants that the water pressure in some channels can be greater than in others. It is believed that this can result in uneven water flow rates and uneven heat removal rates which in turn can cause localized hot spots within the body 31.

The use of aluminum nitride material for the window 37 presents certain other problems. While effective for its transparency to microwaves and impermeability to gases, aluminum nitride is a material which is typically relatively brittle and can crack or fracture relatively easily in the high temperature, operational environment of a microwave applicator.

SUMMARY OF THE PREFERRED EMBODIMENTS

A remote microwave plasma applicator of an improved design is provided. In one embodiment, the plasma applicator comprises a body having a cavity in which a plasma is generated from a gas. The body defines a coolant inlet port, a coolant outlet port and a coolant channel adapted to provide a series coolant flow path from the coolant inlet port to the coolant outlet port.

In one embodiment, the body is generally cylindrical in shape and the coolant channel provides a first flow path in fluid communication with a second flow path. The first flow path follows a generally circular path in a clockwise direction substantially around the circumference of the cylindrical body. The second flow path follows a generally circular path in a counter-clockwise direction substantially around the circumference of the cylindrical body.

In an alternative embodiment, the body has a proximate end opening adapted to admit microwave energy into the cavity and a distal end disposed generally on the opposite side of the cavity from the proximate end opening. The body defines a gas outlet port adapted to permit the flow of an excited gas out of the cavity and a gas inlet port adapted to admit a precursor gas into the cavity. The gas inlet port has a center axis disposed between the proximate end opening of the body and the midpoint between the proximate end opening and the distal end of the body.

In yet another embodiment, a window member is disposed at the proximate end opening and is substantially transparent to microwave energy. An aperture member is adjacent to the window member. The aperture member is adapted to transfer heat from the window member to the body and has an aperture with a generally circular or oval shape.

In still another embodiment, the window member has a substantially planar shape with a first side which faces the cavity, a second side and a perimeter edge. At least two pins are disposed between the perimeter edge of the window member and the body.

In yet another embodiment, an outer member is disposed adjacent to the second side of the window member. A ring member is compressed between the second side of the window member and the outer member. A seal member is disposed between the ring member and the second side of the window member and is adapted to prevent direct contact between the ring member and the window member.

In still another embodiment, a first flange is disposed on the body and a second flange is disposed on the outer member. A clamp is adapted to removably attach the second flange to the first flange.

In yet a further embodiment, the body is integrally formed as a single piece of metal.

BRIEF DESCRIPTION OF THE DRAWINGS

FIG. 13a is a top plan view of the clamp of FIG. 7.

FIG. 13b is a side plan view of the clamp of FIG. 7.

FIG. 13c is a cross-sectional view of the clamp as viewed along lines 13c—13c of FIG. 13a.

FIG. 13d is an enlarged, cross-sectional view of the clamp of FIG. 13c.

FIG. 14a is a top plan view of the seal member of FIG. 7.

FIG. 14b is a cross-sectional view of the seal member as viewed along lines 14b—14b of FIG. 14a.

FIG. 15b is an enlarged cross-sectional view of the alignment pin assembly of FIG. 15a.

FIG. 19 is a cross-sectional view of the plasma applicator as viewed along lines 19—19 of FIG. 17.

FIG. 20a is a cross-sectional view of the plasma applicator showing the interior member piece of the plasma applicator of FIGS. 7 and 11.

FIG. 20b is a cross-sectional view of the interior member piece as viewed along lines 20b—20b of FIG. 20a.

FIG. 21 is a cross-sectional view of the plasma applicator as viewed along lines 21—21 of FIG. 11.

DETAILED DESCRIPTION OF THE PREFERRED EMBODIMENTS

In the following description, reference is made to the accompanying drawings which form a part hereof and which illustrate several embodiments of the present invention. It is understood that other embodiments may be utilized and structural and operational changes may be made without departing from the scope of the present invention.

Figure 7:
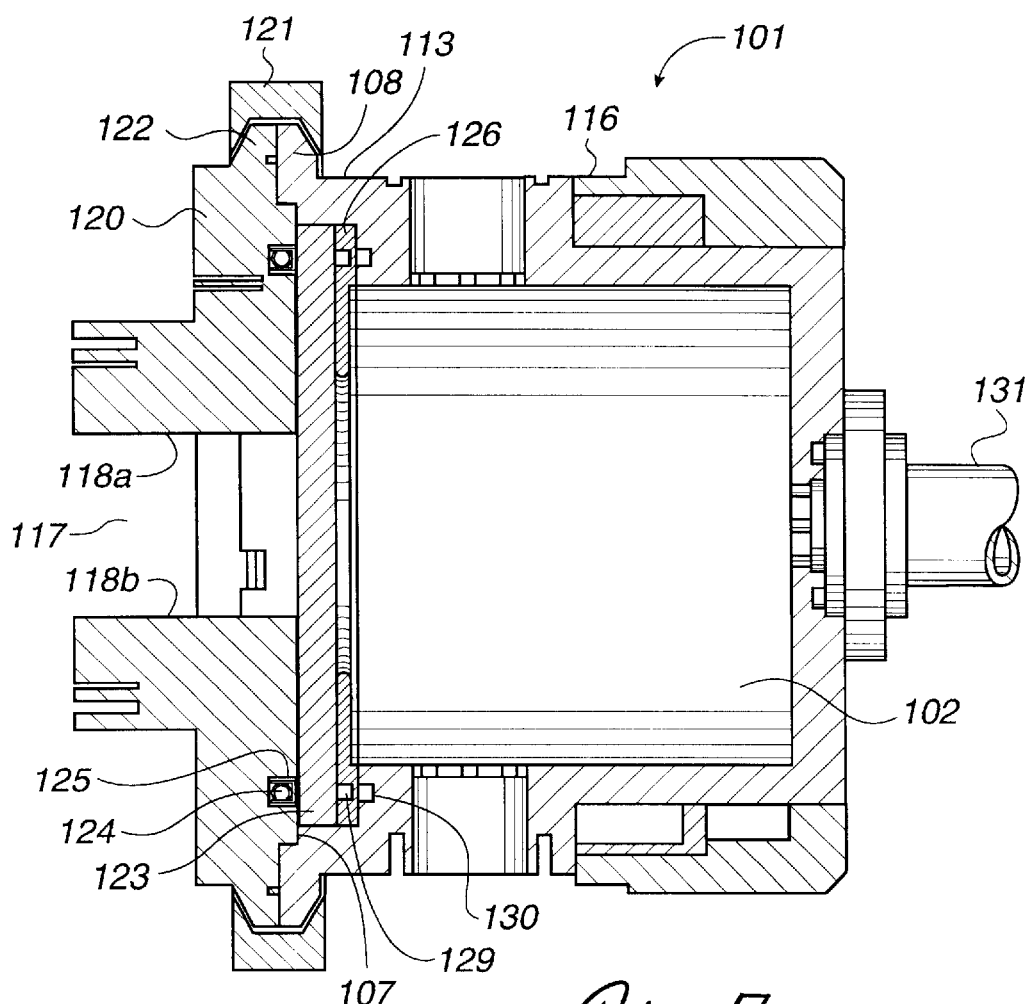
FIG. 7 is a cross-sectional view of a plasma applicator according to one embodiment of the present invention.

A plasma applicator in accordance with one embodiment of the present invention is indicated generally at 101 in FIG. 7. The plasma applicator 101 includes a chamber assembly 113, a removable waveguide adapter 120 and a clamp 121 which secures the adapter 120 to the chamber assembly 113. The waveguide adapter 120 has a rectangular interior channel 117 formed by upper and lower walls 118a and 118b and by two side walls (not shown), along which the microwaves propagate to the chamber assembly 113. From the waveguide adapter 120 the microwaves pass through a removable window 123 and through a removable aperture plate 126 into a chamber body 116 of the assembly 113. A microwave sensor 131 mounted on the chamber body 116 detects the level of microwave energy in the chamber assembly 113.

Referring now to FIGS. 8–11, the chamber body 116 of the illustrated embodiment has an improved, internal coolant channel 115 which is advantageously formed by the joining of a cavity member 103, a rear channel member 104 and a transfer channel member 114 as explained in greater detail below. The transfer channel member 114 and the rear channel member 104 of the illustrated embodiment are circular pieces which are disposed around the rear portion of the cavity member 103 and which are joined to each other and to the cavity member 103 by welding or brazing.

The cavity member 103 is generally cylindrical in shape. In the preferred embodiment of the present invention, it is integrally formed as a single piece of metal. However, alternative embodiments may include cavity members which are formed from multiple pieces.

Figure 1:
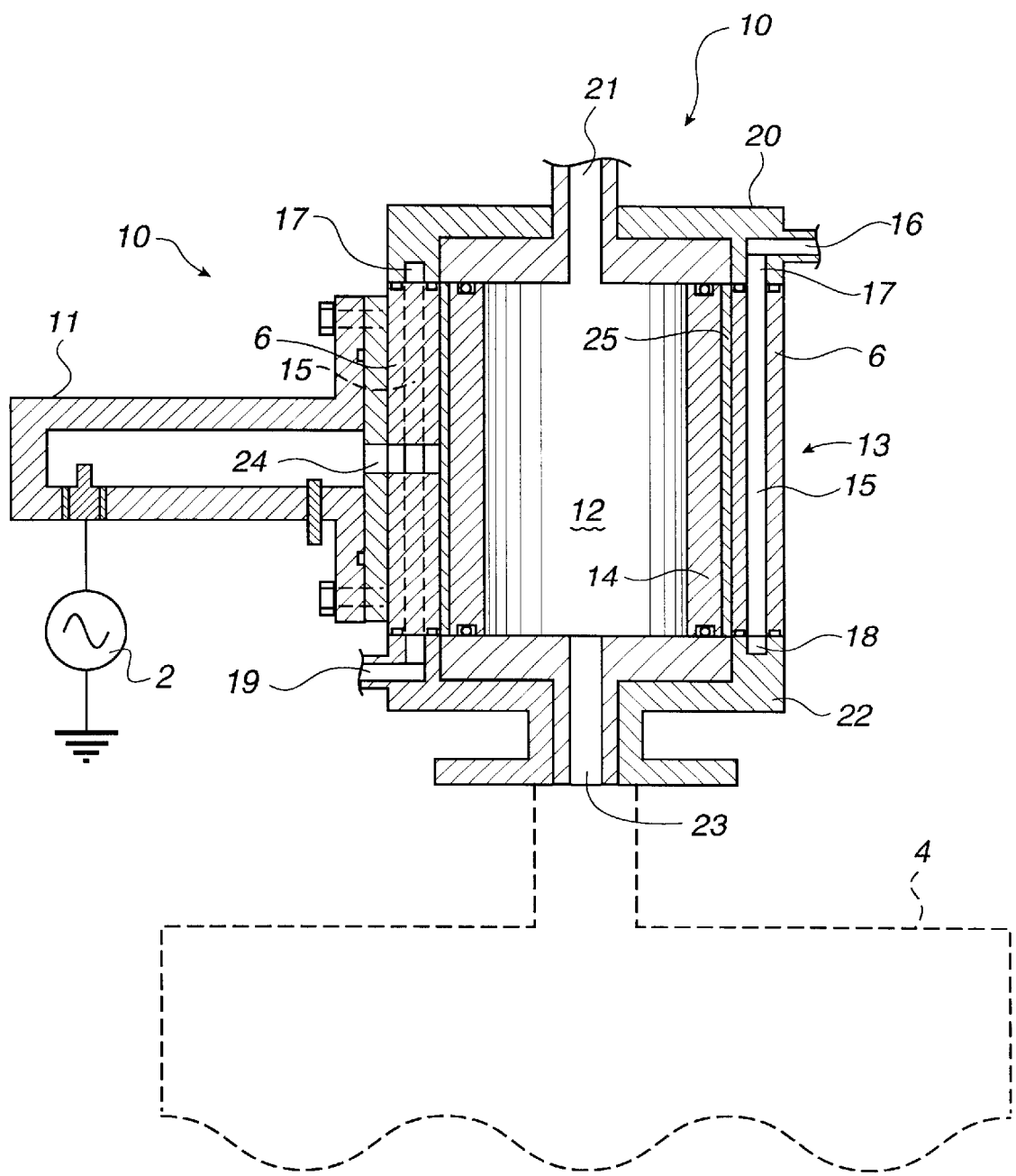
FIG. 1 is a cross-sectional view of a known plasma source.
Figure 2:
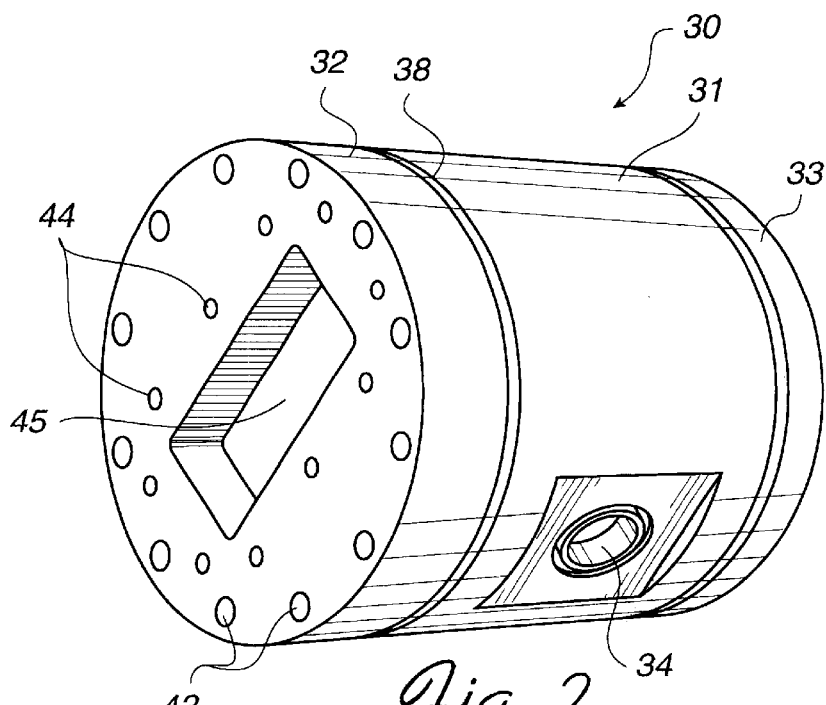
FIG. 2 is a perspective view of a known plasma applicator of a different design.

In the preferred embodiment, the cavity member 103 includes an interior, annular side wall portion 103a and a planar end wall portion 103b which define a generally cylindrically-shaped, resonant cavity 102 having a large front opening 105 through which the radial axis of the cylindrically-shaped cavity 102 extends. The end wall portion 103b contains a sensor port 112 which is comprised of a plurality of holes through which microwaves pass to the microwave sensor 131 (FIG. 7). The construction of the cavity member 103 as a single piece of metal in the preferred embodiment is advantageous over prior art plasma applicators, such as those of FIGS. 1 and 2, in that fewer pieces are used to enclose the resonant cavity 102. Thus fewer O-rings are required with a reduced likelihood of air leakage into the resonant cavity 102. Simpler assembly and reduced manufacturing costs may also be realized.

The large front opening 105 is formed by a window/aperture shoulder 106 which receives and centers both the window 123 and the aperture plate 126, a waveguide adapter shoulder 107 which receives and centers the waveguide adapter 120 and a clamp flange 108 for securing the adapter 120 to the chamber assembly 113 with the clamp 121. A plurality of alignment pins 111 are placed in cylindrical grooves formed in the window/aperture shoulder 106 and function to align the window 123 and aperture 126 in the center of the cavity 102, and as described more fully below, to form a heat barrier between the window 123 and the cavity member 103.

The cavity member 103 further includes a gas inlet port 109 formed on one side of the cavity member 103 and a gas outlet port 110 formed on the opposite side. In one embodiment, each port is 0.870 inches in diameter and is comprised of a plurality of holes to facilitate gas diffusion. Gas enters the resonant cavity 102 through the gas inlet port 109 where the gas will come into contact with the microwave radiation and become reactive. The reactive species exits the resonant cavity 102 through the outlet port 110 where it is directed to another chamber (such as the chamber 4 of FIG. 1) for interacting with the surface of a wafer or for other uses in connection with semiconductor manufacturing.

In the illustrated embodiment, the inlet and outlet ports 109 and 110 are not equidistant between the front opening 105 and the end wall portion 103b; rather they are located forward of the equidistant point—closer to the front opening 105 than the end wall portion 103b. In one embodiment, the centerline of the inlet port 109 is 0.875 inches from the window. However, alternative embodiments include centerline positions ranging from 1.25 inches from the window 123 to a point where the outer diameter of the port 109 is adjacent to the window/aperture shoulder 106. It is believed that the peak of the microwave energy distribution profile in the resonant cavity 102 is also located closer to the front opening 105 than the end wall portion 103b. Thus, by placing the inlet and outlet gas ports in this location, the gas may be directed more closely to the peak of the microwave energy distribution profile thus increasing the efficiency of the gas reactive process.

Referring again to FIG. 7, mated to the waveguide adapter shoulder 107 is the waveguide adapter 120. The adapter shoulder 107 centers the waveguide adapter 120 on the radial centerline of the resonant cavity 102. The waveguide adapter 120 is secured to the plasma applicator 101 by the circular clamp 121.

Adjacent to the waveguide adapter 120 is the window 123 which is constructed of aluminum nitride in the illustrated embodiment. Although opaque to light waves in the visible spectrum, aluminum nitride is a material which is transparent to microwaves yet impermeable to gases in the resonant cavity 102. An aluminum O-ring 124 and a seal ring 125 (FIGS. 14a–14c) are used in combination to form a pressure-tight seal. The O-ring 124 places spring-like tension around the perimeter of the window 123 and presses it inward in the direction of the resonant cavity 102. As explained in greater detail below, the seal ring 125 is situated between the O-ring 124 and the window 123 and spreads the force of the O-ring over a larger area on the window 123.

Figure 12:
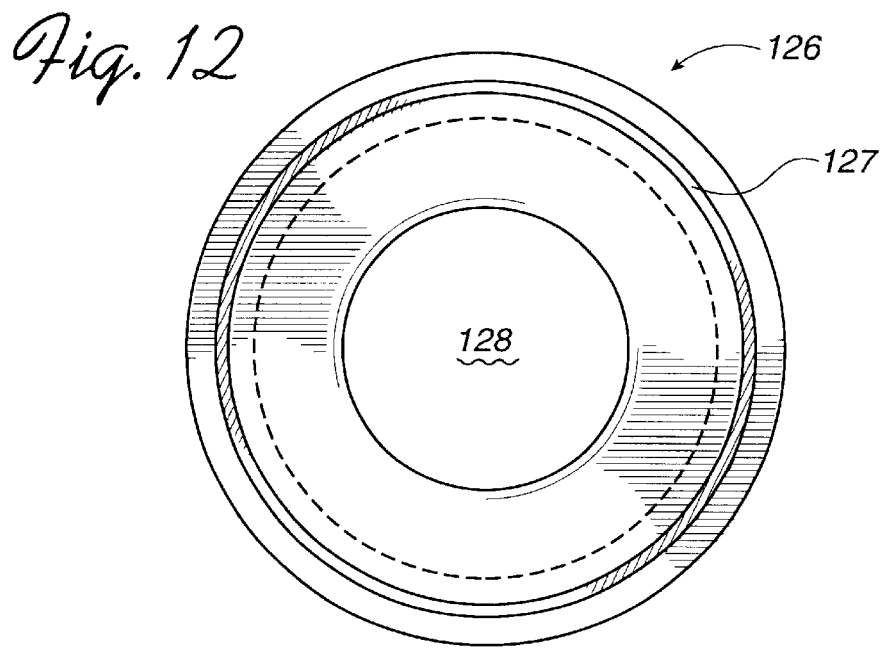
FIG. 12 is a front plan view of the aperture plate of FIG. 7.

Disposed between the window 123 and the resonant cavity 102 is an aluminum aperture plate 126. As best seen in FIG. 12, the aperture plate 126 is circular in shape with a circular groove 127 along the perimeter. The groove 127 is adapted to receive an O-ring seal 129 (FIG. 7). In the center of the aperture plate 126 is a circular aperture 128. In one embodiment the diameter of the aperture 128 is 2.0 inches. However other diameters would be suitable, including diameters ranging from 1.75 to 2.5 inches.

As best seen in FIG. 7, the aperture plate 126 serves as a thermal buffer between the window 123 and the aluminum chamber body 116. As the microwaves pass through the window 123, an intense heat can be generated in the window 123. This heat passes through the plate 126 before reaching the body 116. Should there be any heat damage to the aluminum, the plate 126 is more likely to incur the damage rather than the body 116 and is easier and less expensive to replace than the body 116.

The aperture 128 (FIG. 12) permits the microwaves to pass directly into the resonant cavity 102 from the window 123. The circular shape of the aperture 128 is advantageous over the known, rectangular aperture 39 of the plasma source of FIG. 3. For example, it is believed that the circular aperture transfers heat from the window 123 to the body 103 more uniformly. This can reduce uneven heat transfer from the window 123 which may cause breakage of the window 123. Moreover, this design can reduce sputtering of aluminum into the plasma which can result from localized hot spots on the window 123. While the embodiment of FIG. 12 shows an aperture 128 which is circular, it should be appreciated by those skilled in the art that other shapes, including an oval-shaped aperture, would be suitable as well. If an oval aperture is used, however, it is preferably centered on the opening 117 of the waveguide adapter 120 with the longest axis of the oval positioned either parallel with or orthogonal to a planar surface defined by the upper wall 118a of the waveguide adapter 120.

O-ring seals 129 and 130 form air-tight seals between the cavity member 103, the aperture plate 126 and the window 123. It is preferable that traditional O-ring seals which contain carbon not be used in this environment. When exposed to microwave radiation, the carbon may heat up excessively. Therefore in the illustrated embodiment, the O-ring seals 129 and 130 contain no or substantially no carbon. Rather, they are made of perfluoroelastomer, a material sold under the name Chemraz™ by Greene Tweed & Co. of Hatfield, Pa.

It has been noted by the present inventors that a source of fracture stresses to aluminum nitride windows in known applicator designs can be the mechanical stress associated with the assembly of the plasma applicator. Referring to the known design of FIG. 3, when the front cover plate 32, the window 37, the aperture plate 38 and the body 31 are assembled, a plurality of bolts are extended into the front cover plate bolt holes 43, through corresponding holes in the aperture plate 38 and into similar, threaded holes in the body 31. When these bolts are secured, there is the danger that they may not be uniformly tightened. If they are not, then differential mechanical forces on the cover plate 32 may extend to the window 37 and cause its failure.

An embodiment of the present invention can alleviate this source of fracture stress by use of the clamp 121 in lieu of bolts. Referring now to FIGS. 13a through 13d, the clamp 121 is comprised of a first member 132 and a second member 133, each of which defines a longitudinal channel 150. The first and second members 132 and 133 are each generally semicircular in shape with a flange 134 at each end having a circular hole 135. When the two members are connected, the clamp 121 is generally circular in shape. As best seen in FIG. 7, the channel 150 of the first and second clamp members 132 and 133 receives the clamp flange 108 portion of the cavity member 103 and a flange portion 122 of the waveguide adapter 120. The channel 150 has two side walls 138 (FIG. 13d) which are beveled outwardly. This causes the clamp 121 to squeeze the flanges 108 and 122 together as pressure is applied to the clamp 121.

In order to secure the clamp 121 to the plasma applicator 101, the first and second members 132 and 133 are fastened together to form a complete circle encircling the clamp member flange 108 and the waveguide adapter flange 122. The pair of flanges 134 for each clamp member are mated with the corresponding flanges 134 of the other clamp member. Bolts 152 are placed through corresponding pairs of holes 135 in the clamp flanges 134 and tightened. This secures the first member 132 and the second member 133 to each other as well as to the flanges 108 and 122. (FIG. 7) When secured in this fashion, the clamp 121 can provide more uniform pressure around the perimeter of the waveguide adapter 120, thus reducing the likelihood of breakage of the window 123 which might otherwise be caused by differential mechanical stresses on the waveguide adapter 120. Although bolts are described, it is anticipated that other types of fasteners may be used to fasten the clamp portions together.

An alternative embodiment of the clamp 121 employs a hinge in lieu of one set of bolted flanges 134. Thus the first and second members 132 and 133 maybe hinged together at one end forming a clamp assembly. This embodiment secures the waveguide adapter flange 122 and the clamp flange 108 by the use of only one bolt through one pair of flange holes 135.

Figure 6:
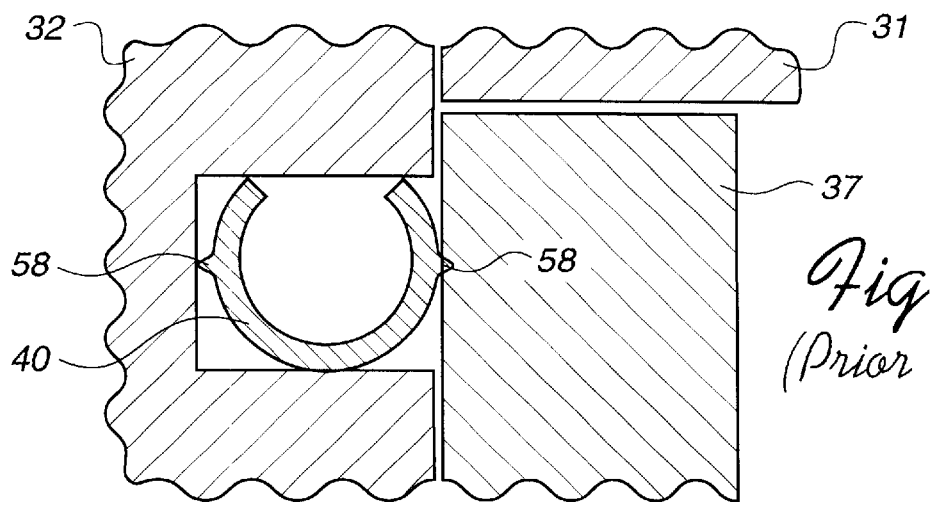
FIG. 6 is a cross-sectional view of an O-ring arrangement of the known plasma applicator of FIG. 2.
Figure 14C:
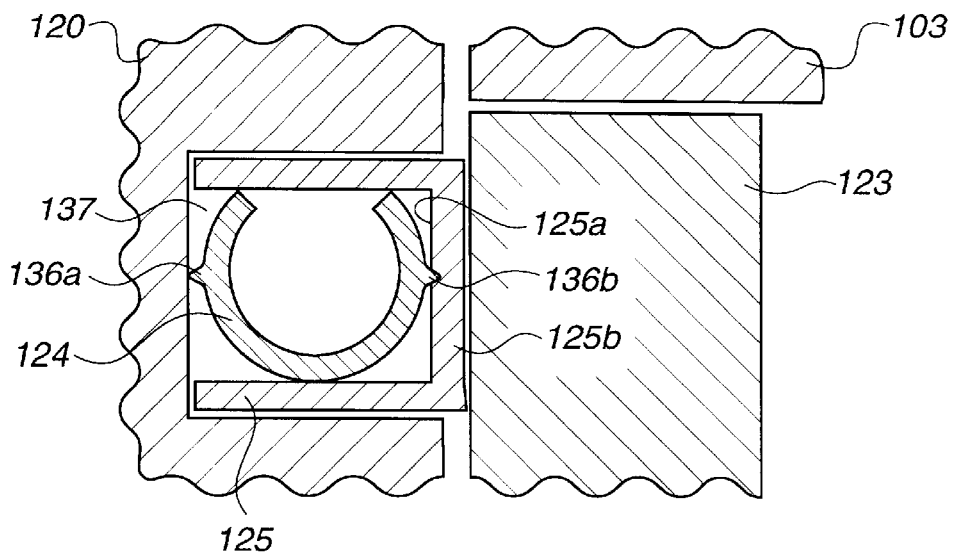
FIG. 14c is an enlarged cross-sectional view of the seal member and O-ring assembly of FIG. 7.

FIGS. 14a–14c show the aluminum O-ring 124 and seal 125 arrangement of an embodiment of the present invention. The O-ring 124 is made of aluminum and has a C-shaped cross-section. Due to manufacturing processes, teats 136a and 136b are formed on the outer walls of the O-ring 124. The O-ring 124 applies uniform, lateral pressure against the aluminum nitride window 123 so that it seats tightly against the O-ring seal 125 located between the window 123 and the aperture plate 126. (FIG. 7) With known O-ring seal arrangements, such as that shown in FIG. 6, a teat 58 of the O-ring directly contacts the aluminum nitride window. Because aluminum nitride is a material that easily cracks, it has been noted by the present inventors that the teat 58 sometimes causes fractures or cracks in the window.

Referring again to FIGS. 14a–14c, the seal 125 is employed to alleviate this problem. The seal 125 is a circular member with a U-shaped cross section which defines a channel 125a adapted to receive the O-ring 124. In one embodiment, the seal 125 has an outer diameter of 4.787 inches, side wall thicknesses of 0.050 inches and a base thickness of 0.075 inches. The seal 125 is placed in a groove 137 in the waveguide adapter 120 and encloses the aluminum O-ring 124 so that the base 125b of the seal 125 abuts the aluminum nitride window 123. (FIG. 14c) When constructed in this manner, the teat 136b of the aluminum O-ring 124 contacts the seal 125 rather than the aluminum nitride window 123 thus spreading the force of the O-ring 124 over a larger area of the window 123 to reduce breakage. The seal 125 is made of polyetheretherketone, a material which is sometimes referred to as PEEK and which is resistant to heat and corrosion. Moreover, it resists heating up excessively when exposed to microwave energy.

Figure 3:
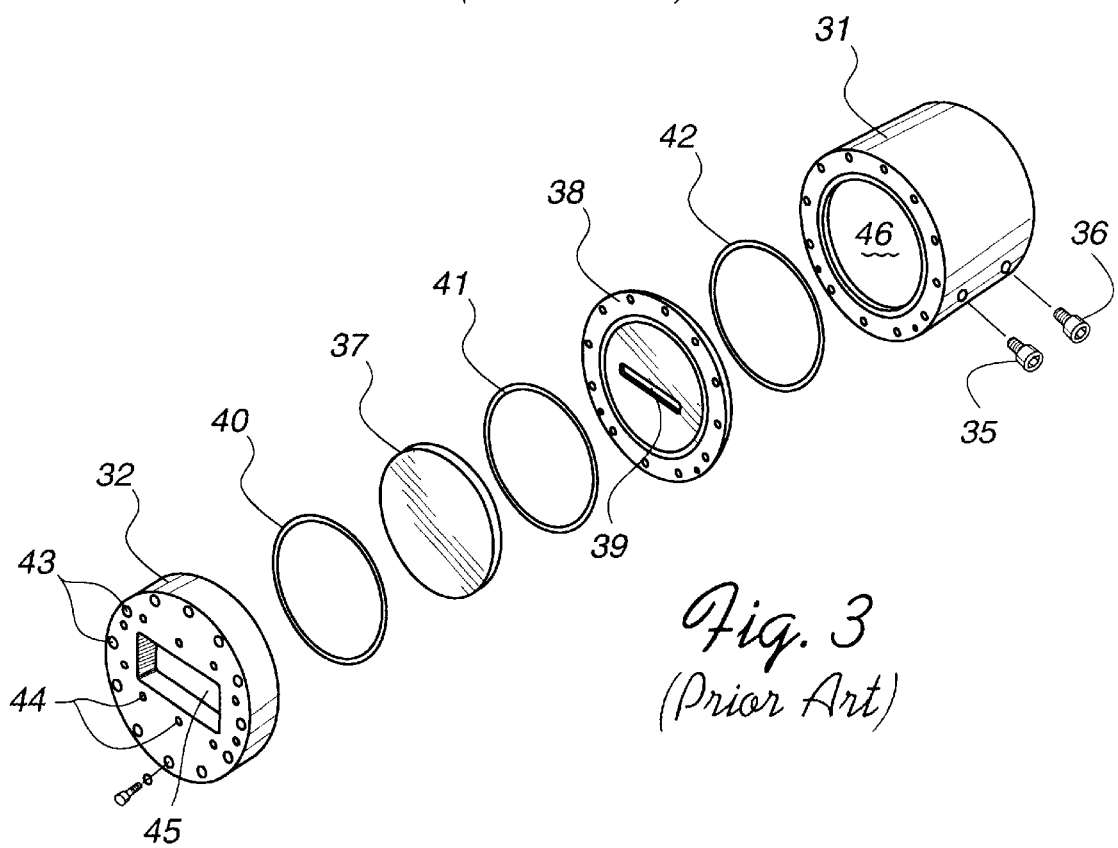
FIG. 3 is an exploded perspective front view of the known plasma applicator of FIG. 2.
Figure 4:
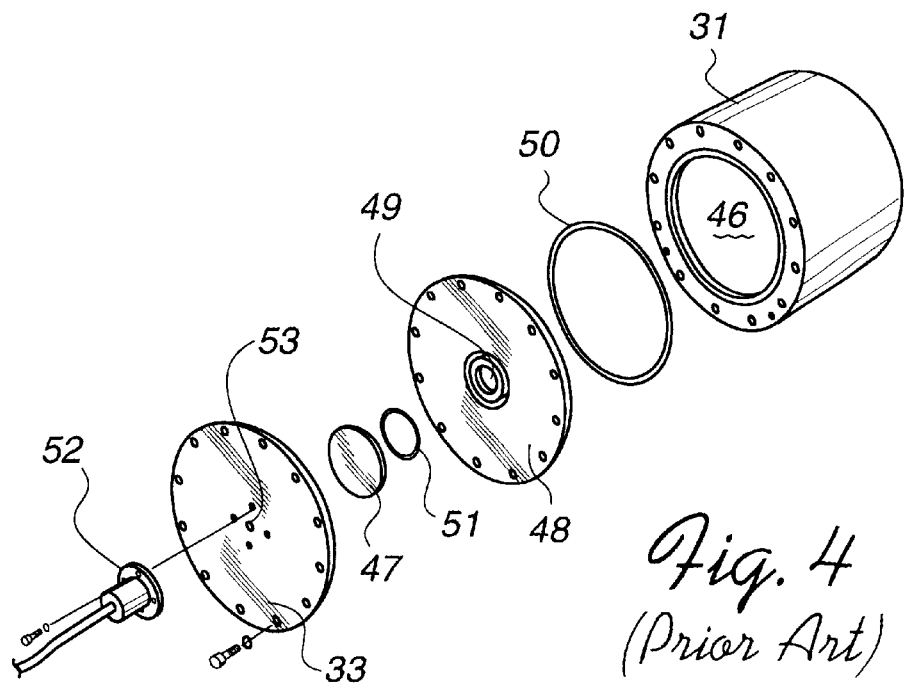
FIG. 4 is an exploded perspective rear view of the known plasma applicator of FIG. 2.

Referring again to the prior art applicator design of FIG. 3, it has been noted by the present inventors that another source of damage to an applicator can be the heat generated in the window 37 by the microwave radiation. The window 37 can become so hot that excessive direct contact between the aluminum body 31 and the window 37 can result in melting of portions of the body 31. The aperture plate 38 is made of aluminum and serves to prevent some of this direct contact by acting as a buffer. However, the perimeter of the window 37 still directly contacts a flange (not shown in FIG. 3) in the body 31 when the window 37 is seated in the body 31. Even this amount of direct contact can at times result in sufficient thermal stresses to cause damage.

Figure 8:
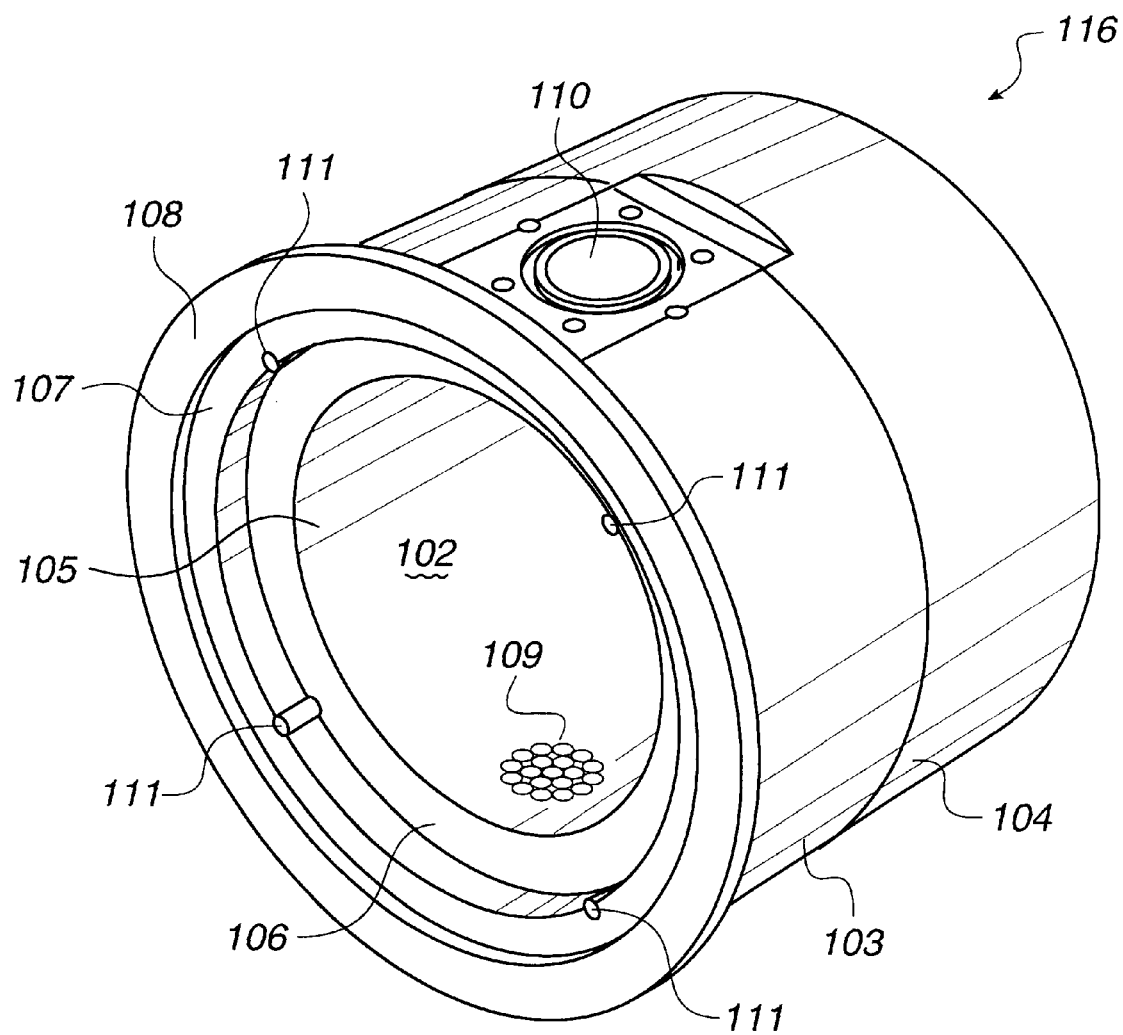
FIG. 8 is a perspective view of a chamber body of the plasma applicator of FIG. 7.
Figure 9:
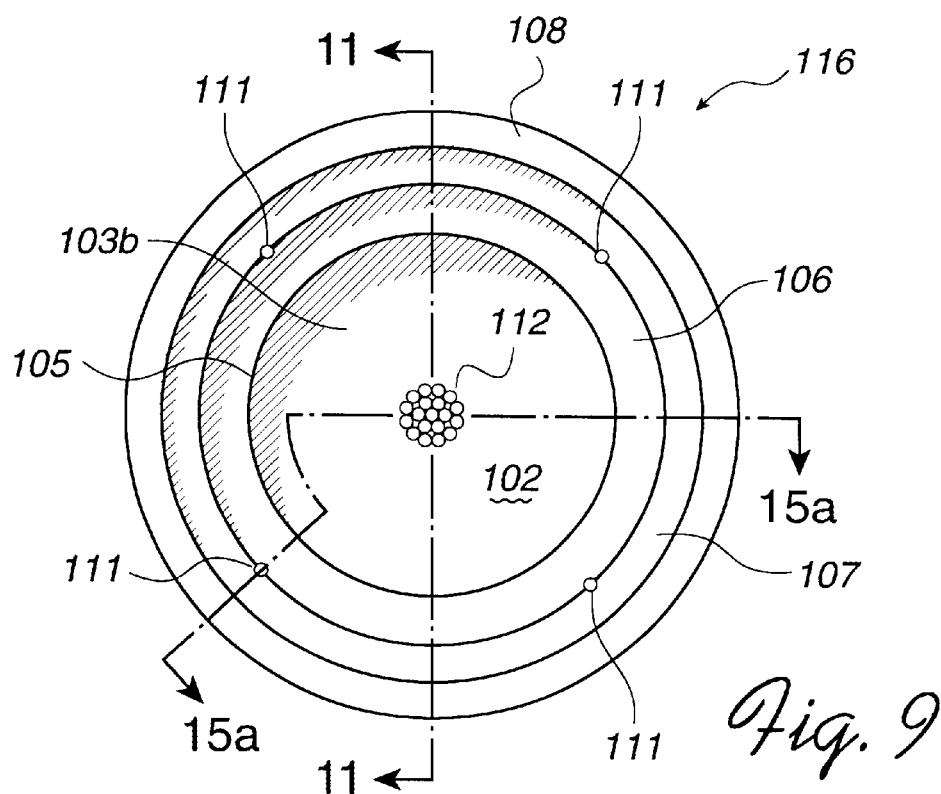
FIG. 9 is a front plan view of the chamber body of FIG. 8.
Figure 10:
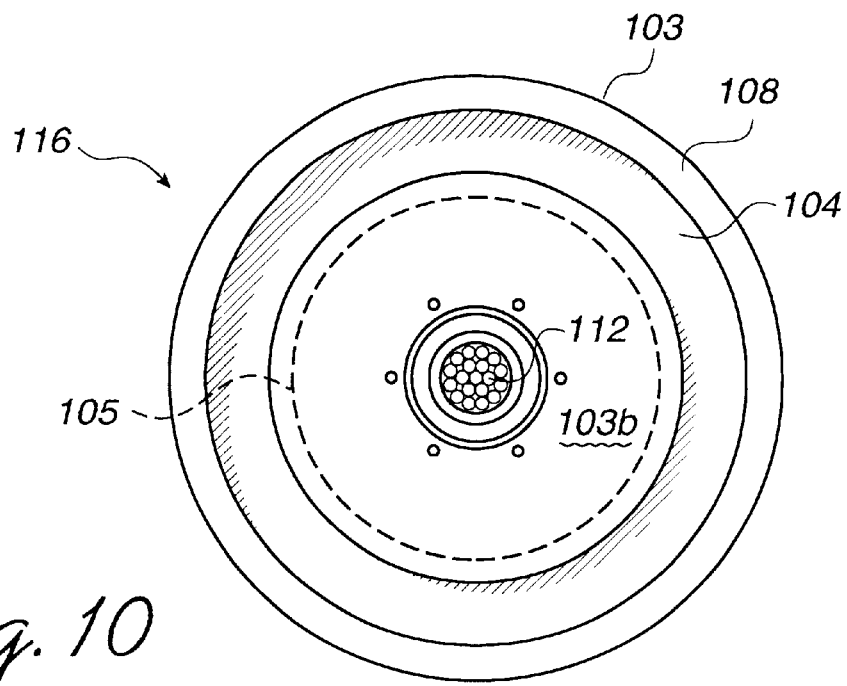
FIG. 10 is a rear plan view of the chamber body of FIG. 8.
Figure 15A:
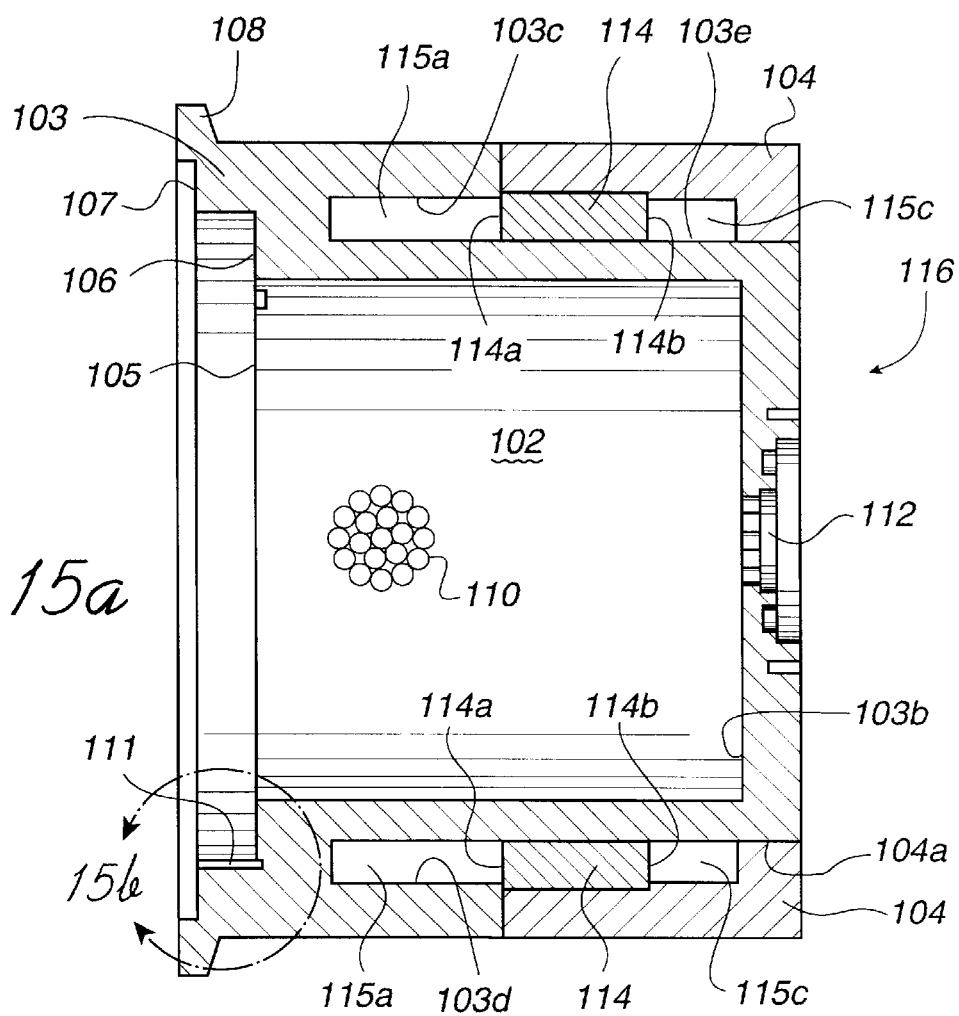
FIG. 15a is a cross-sectional view of the chamber body as viewed along lines 15a—15a of FIG. 9.
Figure 15B:
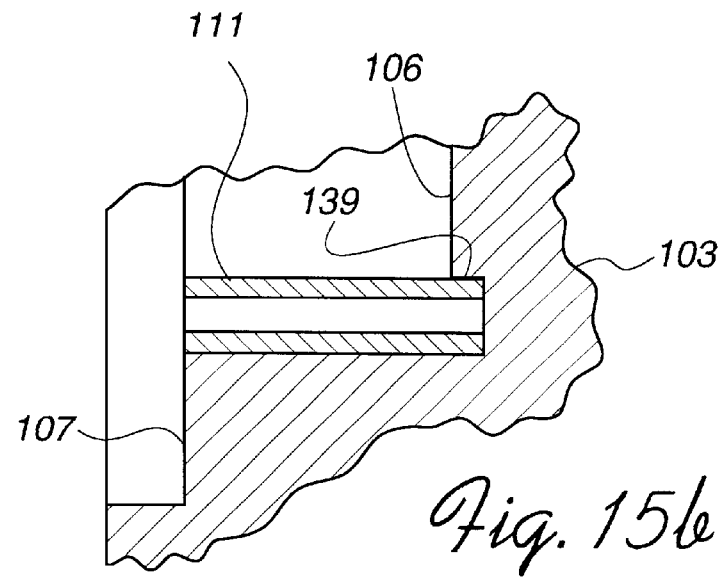
Figure 16:
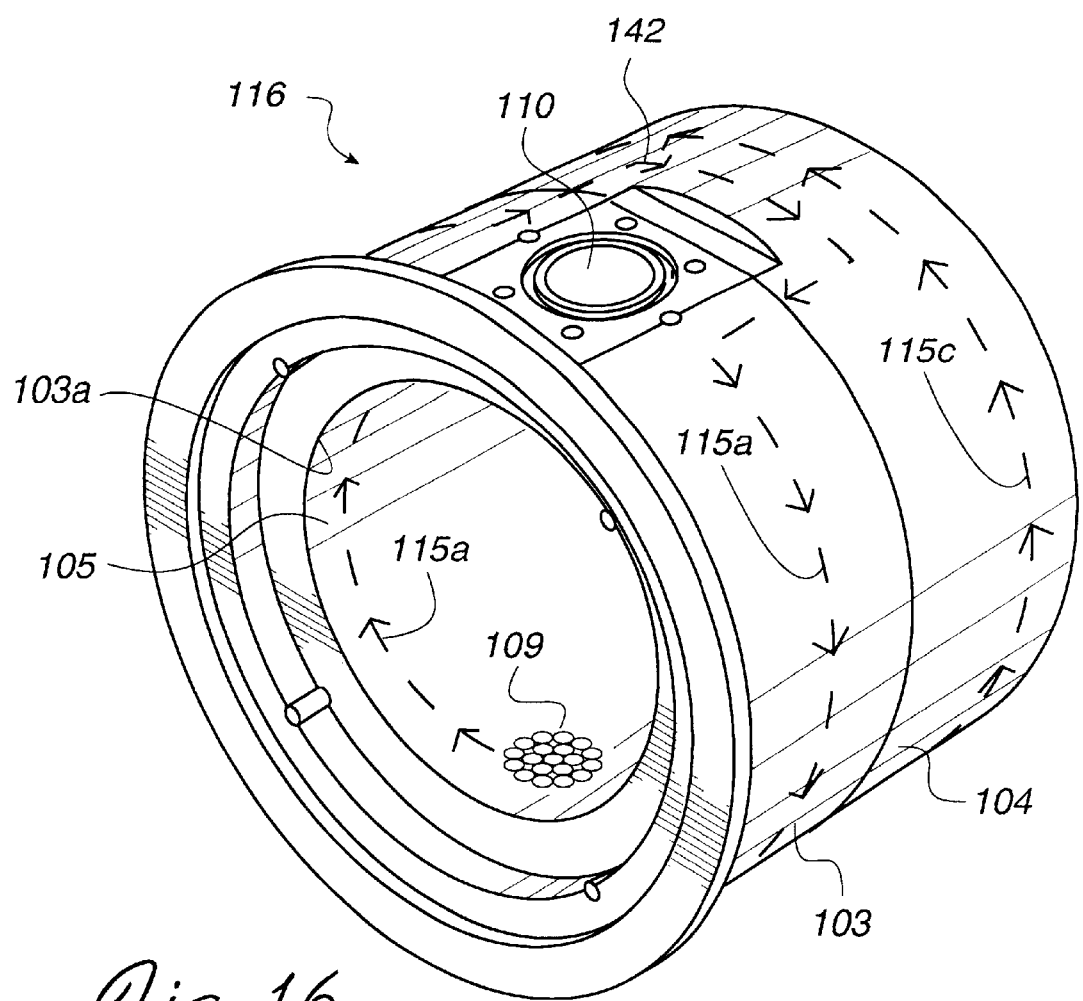
FIG. 16 is a perspective view of the coolant system of the plasma applicator of FIG. 7.

Referring to FIG. 8, this source of damage can be reduced by use of the alignment pins 111. FIGS. 15a and 15b show one alignment pin 111 positioned in the cavity member 103 of the plasma applicator 101. The alignment pin 111 of the illustrated embodiment is a hollow, cylindrically-shaped piece which is received in a groove 139 formed in the window/aperture shoulder 106 portion of the cavity member 103. In one embodiment, the pin 111 is 0.63 inches in length and 0.125 inches in diameter and is made of polyetheretherketone. A plurality of alignment pins 111 are placed in similar grooves spaced around the circumference of the window/aperture shoulder 106. The pins 111 center the aluminum nitride window 123 (FIG. 7) in the window/aperture shoulder 106 and allow the perimeter of the window 123 to contact the alignment pins 111 instead of the aluminum metal cavity member 103.

By preventing direct contact with the cavity member 103, the pins 111 can act as a thermal buffer between the window 123 and the cavity member 103, thus inhibiting thermal damage to the cavity member 103. The material and hollow shape of the pins 111 provides a degree of resilience which allows them to deform in response to the thermal expansion of the window 123. This in turn inhibits fracturing of the window 123. By comparison, if the window 123 were in direct contact with the cavity member 103, the window 123 may fracture as it expands due to the relative rigidity of the cavity member 103. As the window 123 cools and contracts, the shape of the pins 111 can restore due to the memory characteristics of polyetheretherketone.

As explained below, the coolant flow through the chamber body 116 follows a "serpentine-like" path through a single, serial channel 115 which changes direction as the channel 115 winds around the body 116. Referring to FIGS. 15a, 16–18, the coolant channel 115 is comprised of first, second, third and fourth channel sections 115a–115d, two of which, 115a and 115c, are shown in FIG. 15a. The first channel section 115a is formed by a pair of arcuate-shaped grooves 103c and 103d (FIGS. 15a and 19) in the cavity member 103 and a side wall 114a of the annular-shaped transfer channel member 114 which encloses the open side of the grooves 103c and 103d.

The first channel section 115a runs in a generally circular path located generally forward of the midpoint between the large opening 105 and the end wall portion 103b. The third channel section 115c shown in FIG. 15a runs in a generally circular path which is parallel to that of the first channel section 115a, but is located closer to the end wall portion 103b of the cavity member 103. The third channel section 115c is formed by an outer wall 103e of the cavity member 103, another sidewall 114b of the transfer channel member 114 and the interior of the generally annular-shaped rear channel member 104. A flange portion 104a of the member 104 forms a shoulder which defines a portion of the wall which in this embodiment includes two sides which partially enclose the channel portion 115c. The transfer channel member 114 is positioned adjacent to the shoulder of the rear channel member 104 to form a second portion of the wall which in this embodiment includes one side which partially encloses the channel portion 115c. Finally, the flange portion 104a of the member 104 mates with the outer wall 103e of the cavity member 103 which, in turn, forms a third portion of the wall which partially encloses the channel portion 15c.

FIGS. 16–21 show the coolant flow path through the four sections of the coolant channel 115. As shown therein, a coolant, such as water, enters the chamber body 116 via the coolant inlet port 140 (FIG. 17) which is located near the gas inlet port 109. From the coolant inlet port 140 the coolant flows through the first channel section 115a which follows a semicircular, clockwise path following the arcuate groove 103c of the cavity member 103. As the coolant in the first channel section 115a approaches the gas outlet port 110, the coolant flows into a detour leg 142 (FIG. 18) of the first section 115a and around the gas outlet port 110. The detour leg 142 is formed by an arcuate-shaped groove 114c formed in the sidewall 114a of the member 114. (FIGS. 20a and 20b). Upon completion of the detour, the coolant flows into the second groove 103d of the member 103 and continues in its clockwise direction in the first channel section 115a.

Figure 17:
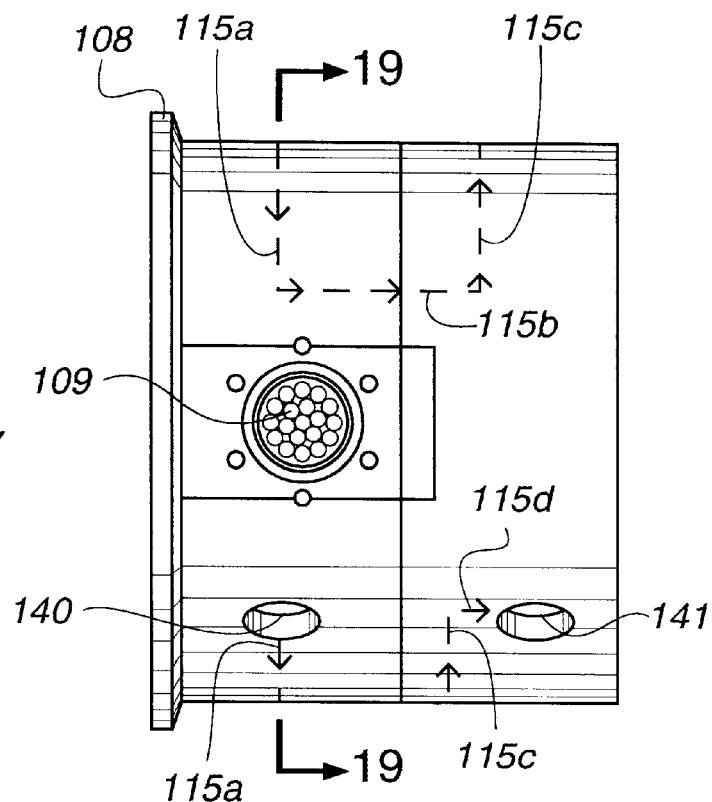
FIG. 17 is a bottom plan view of the coolant system of the plasma applicator of FIG. 7.
Figure 18:
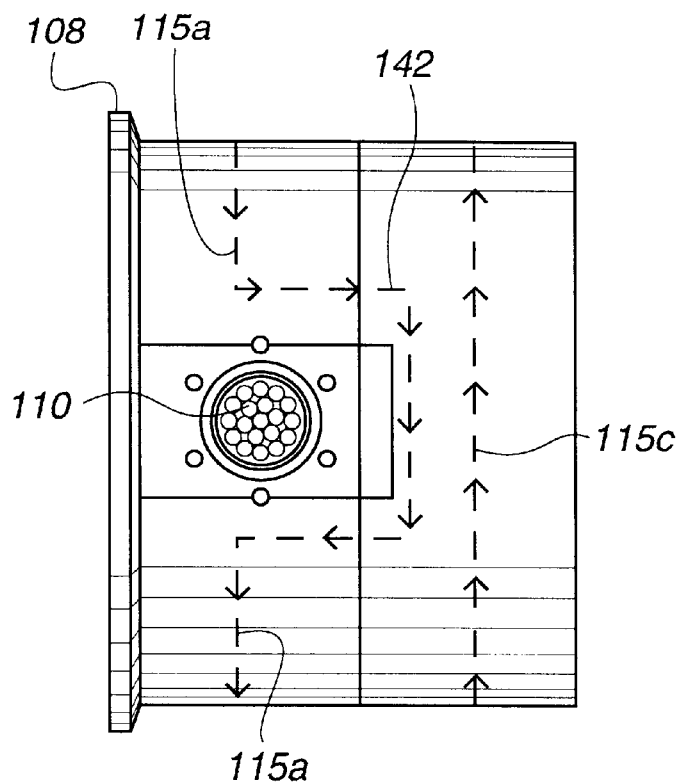
FIG. 18 is a top plan view of the coolant system of the plasma applicator of FIG. 7.

When the coolant in the first channel section 115a approaches the gas inlet port 109, the coolant reverses direction by first entering the second channel section 115b (FIG. 17). This channel section is formed by an axial passageway 114d of the member 114 and follows a straight path in a direction away from the front opening 105 of the chamber body 116. The coolant then flows into the third channel section 115c (FIGS. 17 and 18) formed by the interior of the rear channel member 104 and follows a circular, counter-clockwise path around the outer wall 103e of the cylindrically-shaped side wall portion 103a of the cavity member 103—a direction which is opposite that of the flow in the first channel section 115a. After flowing in excess of 270° radially around the circumference of the cavity member 103, the coolant enters the fourth channel section 115d (FIG. 17) formed by a groove 114e formed in the sidewall 114b of the member 114. There it follows a straight path in a direction away from the front opening 105 for a short distance whereupon the coolant exits the applicator 101 via the coolant outlet port 141.

FIG. 19 is a cross section view of the chamber body 116 as viewed along lines 19—19 of FIG. 17. The clockwise coolant flow is shown from the coolant inlet port 140 through the first channel section 115a and into the detour leg 142 on one side of the gas outlet port 110. The coolant exits the detour leg 142 on the opposite side of the gas outlet port 110 whereupon the coolant continues its clockwise flow through the first channel section 115a. Upon approaching the gas inlet port 109, the coolant enters the second channel section 115b where it flows in a straight path away from the front opening 105 (FIG. 15a) of the resonant cavity 102.

FIGS. 20a and 20b show the transfer channel member 114 of the microwave applicator 101 and the construction of the coolant channels through the transfer channel member 114. FIG. 20a is a plan view of one face of the transfer channel member 114 which mounts to the cavity member 103 (FIG. 15a). FIG. 20b is a cross section view of the transfer channel member 114 as viewed along lines 20b—20b of FIG. 20a. The transfer channel member 114 includes the portion of the detour leg 142 which loops behind the gas outlet port 110 (FIG. 19). Thus the coolant flows in a clockwise direction while in this portion of the detour leg 142.

The transfer channel member 114 further includes the second channel section 115b. When in this section, the coolant flows in a straight path away from the front opening 105 of the resonant cavity 102. The transfer channel member 114 also includes the fourth channel section 115d. When in this section, the coolant flows in a straight path toward the coolant outlet port 141 (FIG.17).

Figure 11:
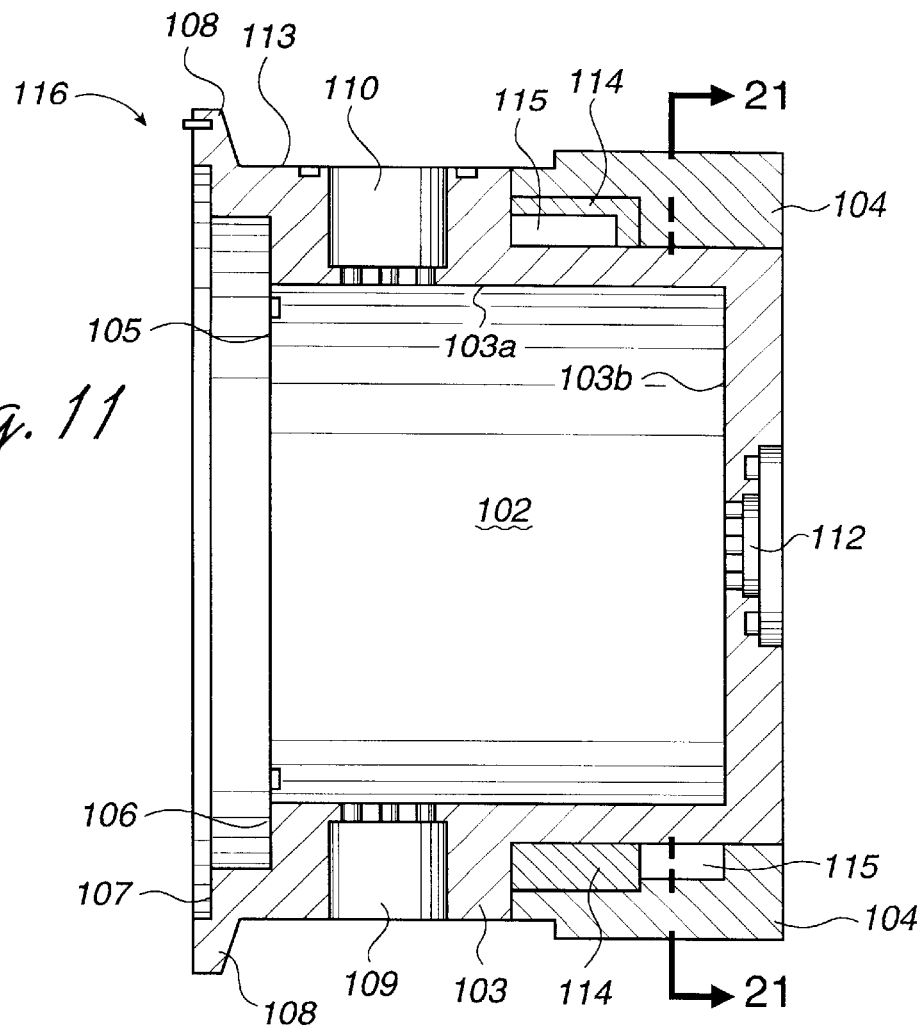
FIG. 11 is a cross-sectional view of the chamber body as viewed along the lines 11—11 of FIG. 9.

FIG. 21 is a cross section view of the chamber body 116 as viewed along lines 21—21 of FIG. 11. Coolant enters the third channel section 115c from the second channel section 115b. (FIG. 20a) Then the coolant flows in a counter-clockwise direction around the circumference of the chamber body 116 in the third channel section 115c which is formed by the walls of the cavity member 103 and the rear channel member 104. After the coolant has traversed the third channel section 115c, it enters the fourth channel section 115d (FIG. 20a) whereupon the coolant exits via the coolant outlet port 141 (FIG. 17).

Figure 5:
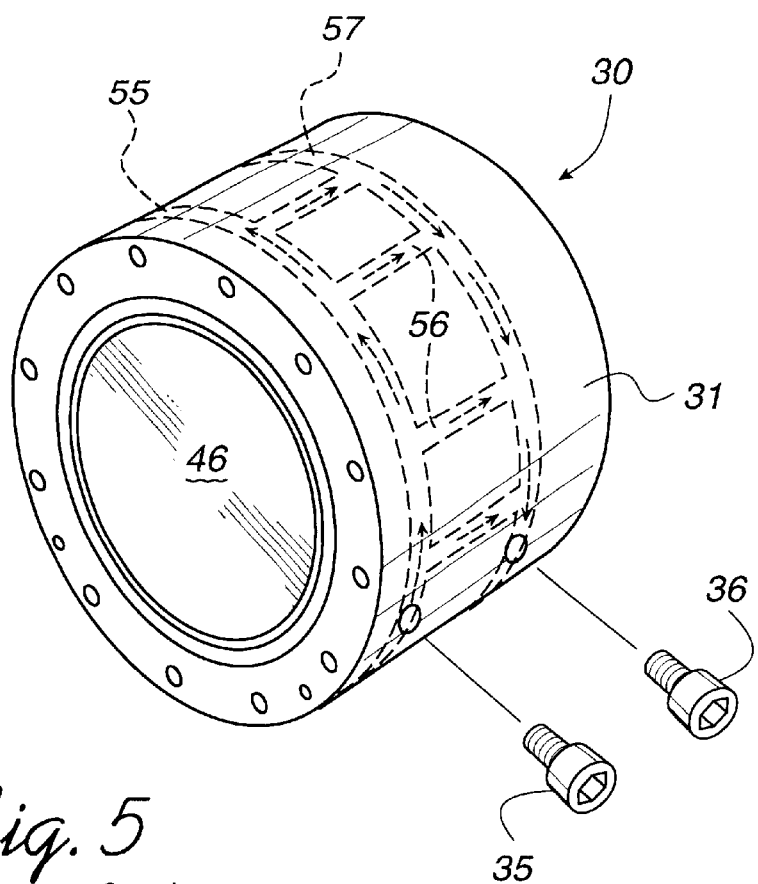
FIG. 5 is a perspective view of the coolant system of the known plasma applicator of FIG. 2.

Unlike the known coolant designs involving parallel flow paths, the novel coolant design of FIGS. 16–21 uses a series flow path and can result in significantly more effective heat removal. For example using water as the coolant, the known parallel path coolant design of FIG. 5 can produce water temperatures of about 115° C. In contrast, water temperatures of about 70° C. have resulted using the design of FIGS. 16–21.

The serpentine-like channel 115 switches direction clockwise and counter clockwise as the channel circumnavigates the body 116. Is should be appreciated that a channel having a more unidirectional flow, such as a helix design, may be used as well.

Figure 22:
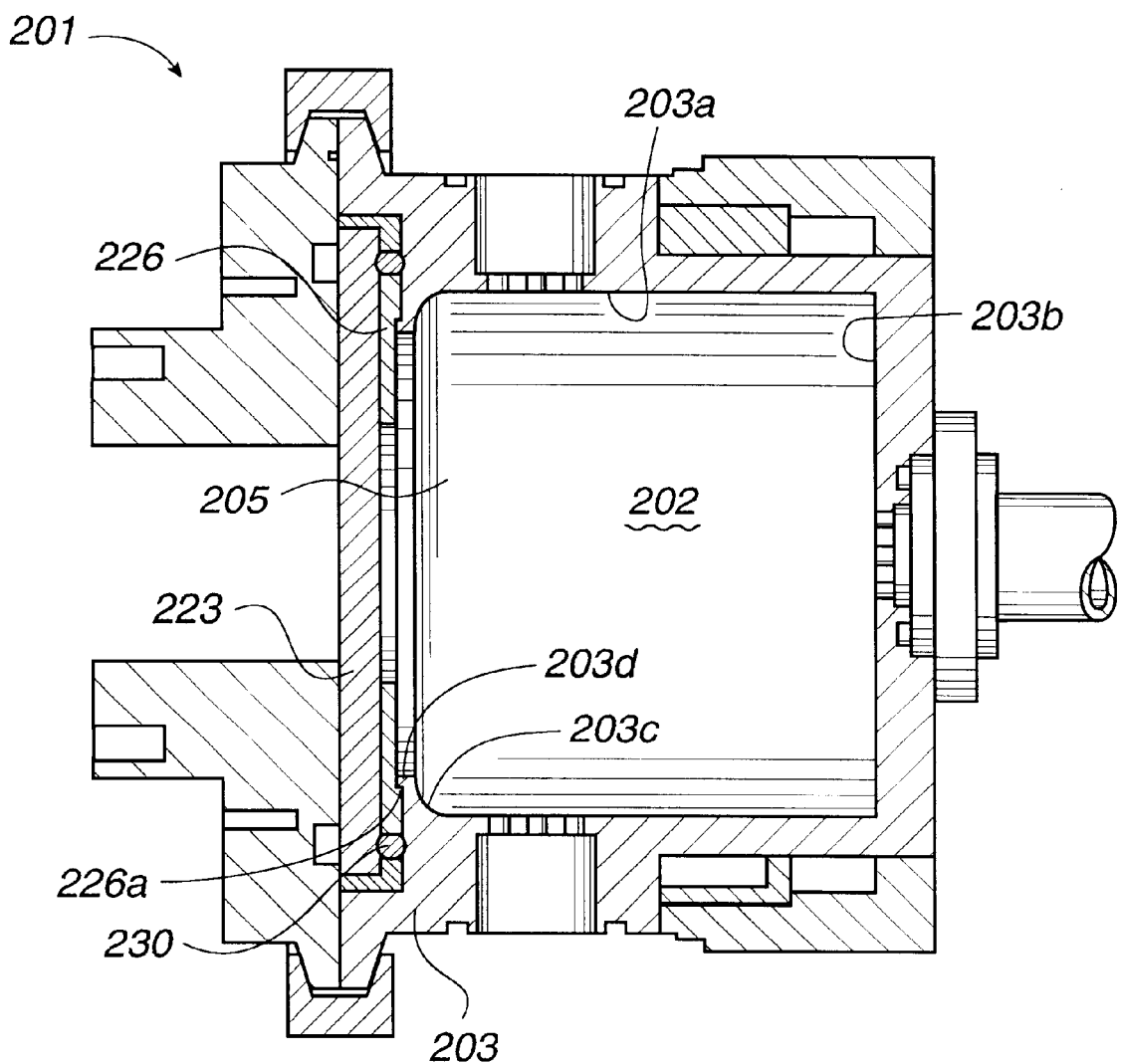
FIG. 22 is a cross-sectional view of a different embodiment of a plasma applicator.

FIG. 22 shows an alternative embodiment of the subject invention. Rather than the use of two perfluoroelastomer O-rings for sealing the resonant cavity, such as those shown by reference numerals 129 and 130 of FIG. 7, the plasma applicator 201 of FIG. 22 uses only one perfluoroelastomer O-ring 230. The O-ring 230 is placed around the outer perimeter of a removable aperture plate 226 and is compressed between a removable, aluminum nitride window 223 and a cavity member 203.

The cavity member 203 defines a generally cylindrical resonant cavity 202 having a circular side wall 203a and a planar end wall 203b. The cavity member 203 further has a large front opening 205 which is enclosed by the aperture plate 226 and the window 223. The front portion of the side wall 203a has a tapered end 203c which terminates in a lip 203d. The lip 203d mates with a shoulder 226a portion of the aperture plate 226 in order to secure and center the aperture plate 226 over the front opening 205 of the resonant cavity 202.

The tapered end 203c portion of the cavity member 203 provides increased surface area for the plate 226 to contact the cavity member 203. This results in a heat flow from the window 223 through the aperture plate 226 and to the cavity member 203 over a wider area. By providing a greater area through which the heat may flow, excessive localized hot spots are less likely to occur which decreases the possibility of heat damage to the plate 226 or the cavity member 203.

While the description above refers to particular embodiments of the present invention, it will be understood that many other modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims rather than the foregoing description, and all changes which come within the meaning and range of equivalency of the claims are therefore intended to be embraced therein.

What is claimed is:

1. A plasma applicator comprising:

a generally cylindrically-shaped body having a cavity in which a plasma is generated from a precursor gas;

the body defining a coolant inlet port, a coolant outlet port, and a coolant channel adapted to provide a series coolant flow path from the coolant inlet port to the coolant outlet port;

the coolant channel has a first flow path that follows a generally circular path in one of a clockwise and a counter-clockwise direction substantially around the circumference of the body in fluid communication with a second flow path that follows a generally circular path in the other of the clockwise and the counter-clockwise direction substantially around the circumference of the body;

the body having a proximate end opening adapted to admit microwave energy into the cavity and a distal end disposed generally on the opposite side of the cavity from the proximate end opening;

the body defining a gas outlet port adapted to permit the flow of an excited gas out of the cavity and a gas inlet port adapted to admit the precursor gas into the cavity, the gas inlet port having a center axis disposed between the proximate end opening of the body and the midpoint between the proximate end opening and the distal end of the body;

a first flange disposed on the body;

a window member positioned over the proximate end opening, the window member being substantially transparent to microwave energy and having a substantially planar shape with a first side, a second side and a perimeter edge, the first side facing the cavity;

at least two pins disposed between the perimeter edge of the window member and the body;

an aperture member adjacent to the window member, the aperture member adapted to transfer heat from the window member to the body, the aperture member having an aperture with one of a generally circular shape and a generally oval shape;

an outer member disposed adjacent to the second side of the window member;

a second flange disposed on the outer member;

a clamp adapted to removably attach the second flange to the first flange;

a ring member compressed between the second side of the window member and the outer member; and a seal member disposed between the ring member and the second side of the window member, the seal member adapted to prevent direct contact between the ring member and the window member.

2. A plasma applicator for use in connection with a precursor gas, comprising:

a generally cylindrically-shaped body having a cavity in which a plasma is generated from said gas, the body having a coolant inlet port, a coolant outlet port, a proximate end opening adapted to admit microwave energy into the cavity and a distal end disposed generally on the opposite side of the cavity from the proximate end opening;

a window member positioned over the proximate end opening, the window member being substantially transparent to microwave energy and having a substantially planar shape with a first side, a second side and a perimeter edge, the first side facing the cavity;

means for introducing a gas into the cavity at a cavity entry point located between the proximate end opening of the body and the midpoint between the proximate end opening and the distal end of the body;

means for attaching a first channel member over an arcuate groove in the body and adjacent to a shoulder portion of a second channel member, thereby defining a first flow path of a coolant channel and defining a first portion of a wall of a second flow path of the coolant channel;

means for securing the second channel member around the body to form a second portion of the wall of the second flow path of the coolant channel, wherein the first flow path follows a generally circular path in one of a clockwise and a counter-clockwise direction substantially around the circumference of the body in fluid communication with the second flow path that follows a generally circular path in the other of the clockwise and the counter-clockwise direction substantially around the circumference of the body, and wherein the coolant channel is adapted to provide a series coolant flow path from said coolant inlet port to said coolant outlet port;

means for separating the perimeter edge of the window member from the body;

means for transferring heat from the window member to the body while permitting microwave energy to flow through the heat transferring means wherein the heat transferring means includes an aperture member which defines an aperture having a shape which is one of a generally circular shape and a generally oval shape;

an outer member disposed adjacent to the second side of the window member;

a ring member compressed between the second side of the window member and the outer member;

seal means for spacing the ring member from the window member; and clamp means for clamping the outer member to the body.

3. A plasma applicator for use in connection with a precursor gas and a source of microwave energy, comprising:

a body having a cavity in which a plasma is generated from said precursor gas;

the body having a proximate end opening adapted to admit microwave energy from said source into the cavity and a distal end disposed generally on the opposite side of the cavity from the proximate end opening;

the body defining a gas outlet port adapted to permit the flow of an excited gas out of the cavity and a gas inlet port adapted to admit the precursor gas into the cavity, the gas inlet port having a center axis disposed between the proximate end opening of the body and the midpoint between the proximate end opening and the distal end of the body.

4. The plasma applicator of claim 3 further comprising:

a window member positioned over the proximate end opening, the window member being substantially transparent to microwave energy and having a substantially planar shape with a first side and a second side, the first side facing the cavity; wherein the center axis is disposed approximately 0.875 inches from the first side of the window member.

5. The plasma applicator of claim 3 further comprising:

a window member positioned over the proximate end opening, the window member being substantially transparent to microwave energy and having a substantially planar shape with a first side and a second side, the first side facing the cavity; wherein the gas inlet port further has a perimeter; and wherein the gas inlet port is disposed in a position between the point where the gas inlet port perimeter is adjacent to the first side of the window and the point where the gas inlet port center axis is 1.25 inches from the first side of the window.

6. A plasma applicator for use in connection with a precursor gas and a source of microwave energy, comprising:

a body having a cavity in which a plasma is generated from said precursor gas;

the body having a proximate end opening adapted to admit microwave energy from said source into the cavity and a distal end disposed generally on the opposite side of the cavity from the proximate end opening;

means for introducing the precursor gas into the cavity at a cavity entry point located between the proximate end opening of the body and the midpoint between the proximate end opening and the distal end of the body; and means for removing an excited gas from the cavity.

7. A plasma applicator for use in connection with a precursor gas and a source of microwave energy, comprising:

a body having a cavity in which a plasma is generated from the precursor gas;

the body having opening means for admitting microwave energy from said source into the cavity wherein said energy exhibits a peak microwave energy level at a location within the cavity;

means for introducing the precursor gas into the cavity at said location of peak microwave energy level; and means for removing an excited gas from the cavity.

* * * * *